(12) United States Patent
Yonemura et al.

(10) Patent No.: US 12,426,510 B2
(45) Date of Patent: Sep. 23, 2025

(54) PIEZOELECTRIC ELEMENT

(71) Applicant: Seiko Epson Corporation, Tokyo (JP)

(72) Inventors: Takayuki Yonemura, Suwa (JP); Jiro Kato, Suwa (JP)

(73) Assignee: SEIKO EPSON CORPORATION (JP)

( * ) Notice: Subject to any disclaimer, the term of this patent is extended or adjusted under 35 U.S.C. 154(b) by 911 days.

(21) Appl. No.: 17/586,951

(22) Filed: Jan. 28, 2022

(65) Prior Publication Data

US 2022/0246826 A1 Aug. 4, 2022

(30) Foreign Application Priority Data

Jan. 29, 2021 (JP) ................. 2021-013649

(51) Int. Cl.
*H10N 30/00* (2023.01)
*H10N 30/857* (2023.01)

(52) U.S. Cl.
CPC ......... *H10N 30/702* (2024.05); *H10N 30/857* (2023.02)

(58) Field of Classification Search
CPC ... H10N 30/857; H10N 30/875; H10N 30/702
See application file for complete search history.

(56) References Cited

U.S. PATENT DOCUMENTS 3,763,530 A * 10/1973 Helfen ............... H03H 9/176
29/25.35
9,627,605 B2 * 4/2017 Ando ............... H10N 30/857
2012/0025674 A1 2/2012 Yoshida et al.
2018/0108826 A1 4/2018 Tajitsu et al.
2022/0246827 A1 * 8/2022 Yonemura ............. B29C 64/321
(Continued)

FOREIGN PATENT DOCUMENTS

JP 5383790 B2 1/2014
JP 2015-015283 A 1/2015
JP 6271121 B2 1/2018
(Continued)

OTHER PUBLICATIONS

S. Hayashi, et al., "Piezoelectric Characteristics of Three-Dimensional Solid Object of Poly(L-Lactide) Fabricated by Three-Dimensional Printing", Japanese Journal of Applied Physics, vol. 54, 10NF01-5 (2015) (3 pages).

(Continued)

*Primary Examiner* — J. San Martin
(74) *Attorney, Agent, or Firm* — Harness, Dickey & Pierce, P.L.C.

(57) ABSTRACT

A piezoelectric element includes a piezoelectric layer containing a helical chiral polymer exhibiting piezoelectric properties, a first electrode layer, a second electrode layer, a first coupling portion provided on the first electrode layer, and a second coupling portion provided on the second electrode layer, in which an overlapped portion where the piezoelectric layer, the first electrode layer, and the second electrode layer overlap is circular shaped when viewed along a thickness direction of the piezoelectric layer, and the first coupling portion and the second coupling portion overlap with a center of the overlapped portion when viewed along the thickness direction of the piezoelectric layer.

7 Claims, 10 Drawing Sheets

(56) References Cited

U.S. PATENT DOCUMENTS

2023/0006128 A1\* 1/2023 Hara .................... H10N 30/857

FOREIGN PATENT DOCUMENTS

| JP | 2019-026691 A | 2/2019 |
|----|---------------|--------|
| JP | 6592780 B2 | 10/2019 |
| JP | 6663085 B2 | 3/2020 |
| WO | 2016-175321 A1 | 11/2016 |

OTHER PUBLICATIONS

M. Yoshida et al., "Proceedings of the Institute of Electrostatics", Japanese Institute of Electrostatics, Japan, Sep. 24, 2015, with English translation (29 pages).

\* cited by examiner

PIEZOELECTRIC ELEMENT

The present application is based on, and claims priority from JP Application Serial Number 2021-013649, filed Jan. 29, 2021, the disclosure of which is hereby incorporated by reference herein in its entirety.

BACKGROUND

1. Technical Field

The present disclosure relates to a piezoelectric element.

2. Related Art

Piezoelectric polymers, which have processability inherent to polymeric materials, are used in a variety of forms. For example, WO 2016/175321 discloses a braided piezoelectric element coated by winding piezoelectric fibers formed of piezoelectric polymer around the surface of a conductive fiber formed of electrically conductive material. For the braided piezoelectric element thus configured, a piezoelectric fiber containing a piezoelectric polymer uniaxially oriented in the fiber axial direction is used. Also, WO 2016/175321 discloses a piezoelectric fiber wound around a conductive fiber by a winding angle in an oblique direction set from 15 degrees to 75 degrees. By setting the winding angle in such a range, shear stress occurs in the piezoelectric fiber, which makes it possible, due to the piezoelectric effect, to extract a large electric signal via the conductive fiber.

Unfortunately, the braided piezoelectric element has a complicated structure, resulting in increased difficulty in manufacturability. Also, the braided piezoelectric element, which has particular type of formation, is hard to be handled as a piezoelectric element.

SUMMARY

A piezoelectric element according to an application example of the present disclosure includes a piezoelectric layer including a first plane and a second plane having a front and back relationship with each other, the piezoelectric layer containing a helical chiral polymer exhibiting piezoelectric properties, a first electrode layer provided on the first plane of the piezoelectric layer, a second electrode layer provided on the second plane of the piezoelectric layer, a first coupling portion provided on the first electrode layer, and a second coupling portion provided on the second electrode layer, in which an overlapped portion where the piezoelectric layer, the first electrode layer, and the second electrode layer overlap is circular shaped when viewed along a thickness direction of the piezoelectric layer, and the first coupling portion and the second coupling portion overlap with a center of the overlapped portion when viewed along the thickness direction of the piezoelectric layer.

DESCRIPTION OF EXEMPLARY EMBODIMENTS

A piezoelectric element of the present disclosure will be described in detail below with reference to the accompanying drawings.

Figure 1:
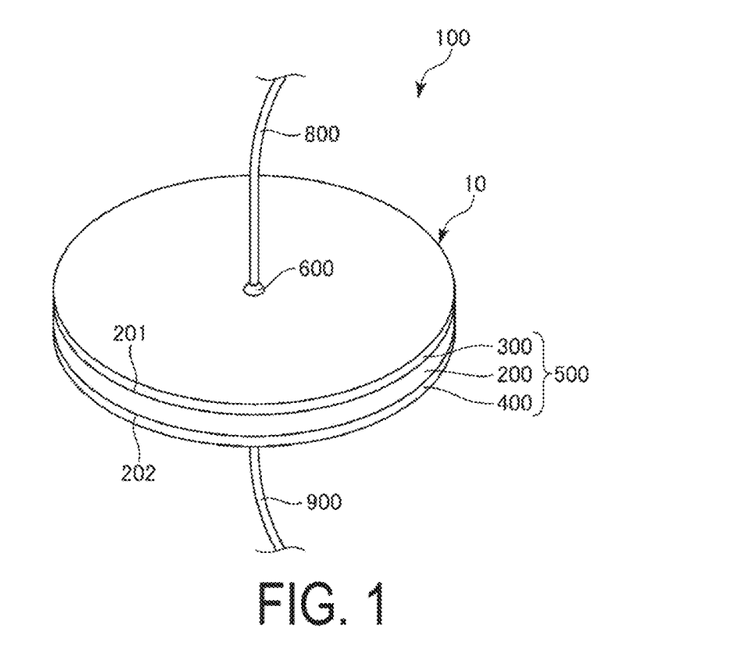
FIG. 1 is a perspective view illustrating a piezoelectric element according to an embodiment.
Figure 2:
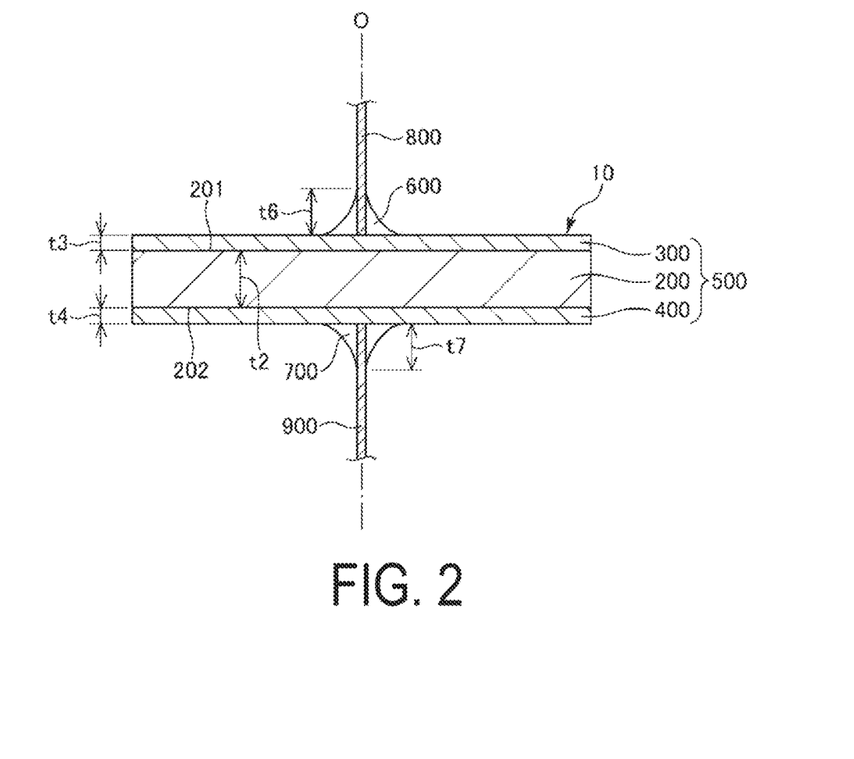
FIG. 2 is a cross-sectional view of a piezoelectric element illustrated in FIG. 1.
Figure 3:
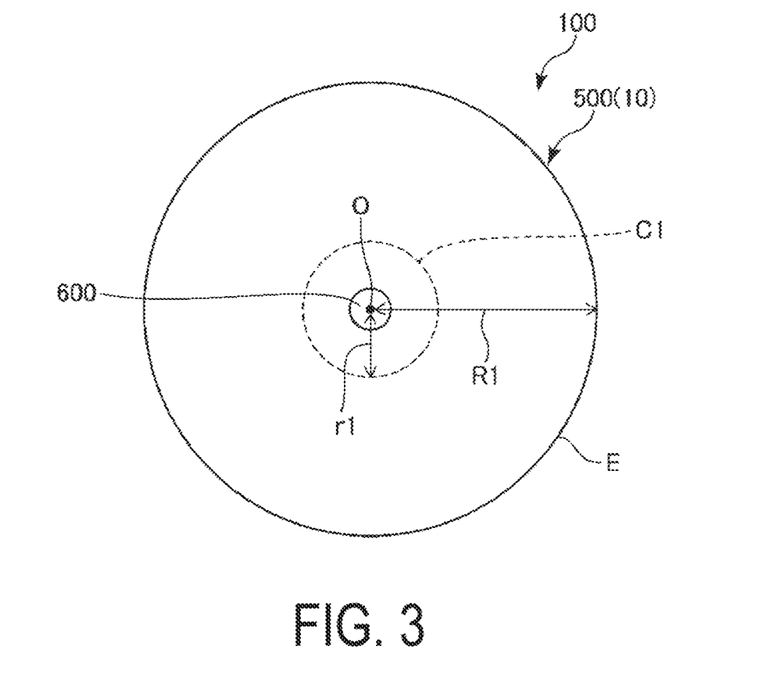
FIG. 3 is a plan view of a piezoelectric element illustrated in FIG. 1.

FIG. 1 is a perspective view illustrating the piezoelectric element according to the embodiment. FIG. 2 is a cross-sectional view of the piezoelectric element illustrated in FIG. 1. FIG. 3 is a plan view of the piezoelectric element illustrated in FIG. 1.

1. Piezoelectric Element

A piezoelectric element 100 illustrated in FIGS. 1 and 2 includes a layered body 500 including a piezoelectric layer 200, a first electrode layer 300, and a second electrode layer 400. The piezoelectric layer 200 includes a first plane 201 and a second plane 202 that have a front and back relationship with each other. The first electrode layer 300 is provided at the first plane 201 of the piezoelectric layer 200. The second electrode layer 400 is provided at the second plane 202 of the piezoelectric layer 200.

Note that the piezoelectric element 100 may include members other than these members. For example, an adhesive layer or the like may be interposed between the piezoelectric layer 200, and the first electrode layer 300 and the second electrode layer 400. A protective film or the like covering the layered body 500 may also be provided.

The layered body 500 illustrated in FIGS. 1 and 2 is circular shaped in plan view, as illustrated in FIG. 3. Specifically, the piezoelectric layer 200, the first electrode layer 300, and the second electrode layer 400 are each circular shaped in plan view, and have the same size as one another.

Examples of the circular shape include an exact circle, an ellipse, a long circle, and the like, for example, and may be an exact circle. The exact circle refers to a shape in which the difference between the lengths of the long axis and the short axis is not greater than 10% of the length of the long axis. The long axis is the longest axis that can be viewed in plan view, and the short axis is an axis passing through a midpoint of the long axis in plan view and orthogonal to the long axis.

A first wiring 800 and a second wiring 900 are coupled to the piezoelectric element 100. One end of the first wiring 800 is coupled to the center portion of the first electrode layer 300 having a circular shape via a first coupling portion 600. One end of the second wiring 900 is coupled to the center portion of the second electrode layer 400 having a circular shape via a second coupling portion 700.

The other end of the first wiring 800 and the other end of the second wiring 900 are each coupled to a non-illustrated power supply device, for example. This allows a voltage to be applied between the first electrode layer 300 and the second electrode layer 400 and an inverse piezoelectric effect to be exhibited at the piezoelectric layer 200. In this case, the piezoelectric element 100 is used incorporated into a device such as an actuator, a vibration generator, a ultrasonic motor, and the like, for example.

Also, the other end of the first wiring 800 and the other end of the second wiring 900 may each be coupled to a non-illustrated electric charge detection device, for example. This allows an electric charge generated by the piezoelectric effect in the piezoelectric layer 200 to be extracted from the first electrode layer 300 and the second electrode layer 400, thereby enabling the charge detection device to detect an electric charge amount. A force applied to the piezoelectric layer 200 can be determined and an electric power required for switch operation or power generation can be generated, based on the detected electric charge amount. In this case, the piezoelectric element 100 various types of force sensors such as a tactile sensor, a force sensor, and various types of switches, a power generator, and the like, for example, The piezoelectric element 100 may also be coupled to a voltage detection device. This allows the voltage detection device to detect a voltage generated by the piezoelectric effect.

Examples of constituent materials of the first electrode layer 300 and the second electrode layer 400 include metal materials such as a simple substance of a metallic element of gold, silver, platinum, copper, nickel, aluminum, indium, tin, zinc, palladium, and the like, and a metal alloy and an intermetallic compound that contain these metallic elements, for example. In addition to these metal materials, resin materials such as a conductive polymer and the like can be exemplified.

An average thickness t3 of the first electrode layer 300 and an average thickness t4 of the second electrode layer 400 that are illustrated in FIG. 2, which are not particularly limited, are each preferably from 0.05 μm to 500 μm and more preferably from 0.50 μm to 300 μm.

Examples of the first coupling portion 600 and the second coupling portion 700 that are used include bonding metal materials such as solder and a wax material, a conductive paste, a conductive adhesive, and the like, for example. The first coupling portion 600 illustrated in FIG. 2, which adheres or joined to both the first electrode layer 300 and the first wiring 800, has, as one example, a shape of expanding the diameter of the first wiring 800. Similarly, the second coupling portion 700 illustrated in FIG. 2, which adheres or joined to both the second electrode layer 400 and the second wiring 900, has a shape such that the diameter of the second wiring 900 is expanded, as one example.

Examples of constituent materials of the first coupling portion 600 and the second coupling portion 700 include metal materials such as a simple substance of a metallic element of gold, silver, platinum, copper, nickel, aluminum, indium, tin, zinc, palladium, and the like, and a metal alloy and an intermetallic compound that contain these metallic elements, for example. In addition to these materials, resin materials such as a conductive polymer and the like can be exemplified.

Note that the constituent materials of the first coupling portion 600 and the second coupling portion 700 may be the same as or different from the constituent materials of the first electrode layer 300 and the second electrode layer 400.

An average thickness t2 of the piezoelectric layer 200. which is not particularly limited, is preferably from 100 μm to 5000 μm, more preferably from 30 μm to 1000 μm, and still more preferably from 50 μm to 500 μm. This allows the piezoelectric layer 200 to have sufficient piezoelectric performance.

The piezoelectric layer 200 contains a helical chiral polymer exhibiting piezoelectric properties. The helical chiral polymer refers to a polymer having helical structure and having molecular optical activity. Further, the helical chiral polymer refers to a crystal which consists of such a helical chiral polymer.

Examples of the helical chiral polymer include a polypeptide, a cellulose derivative, a polylactic acid, a polypropylene oxide, and a poly-β-hydroxybutyric acid, for example.

The helical chiral polymer used in the embodiment has a molecular structure that is a helical structure as described above, and in particular, provided that the axis of the helical structure is a c-axis, it is preferred for the helical chiral polymer to be a crystal in which the c-axis is uniaxially oriented in a plane of the piezoelectric layer 200.

In the piezoelectric layer 200 thus configured, the c-axis of the helical chiral polymer is uniaxially oriented in the plane, which enables to exhibit large polarization in the thickness direction of the piezoelectric layer 200. This makes it possible to obtain the piezoelectric layer 200 configured to more efficiently apply an electric field or extract an electric charge using the first electrode layer 300 and the second electrode layer 400.

The piezoelectric layer 200, which contains a helical chiral polymer in which the c-axis is uniaxially oriented in the plane, can be manufactured by an already-existing film manufacturing method such as uniaxial extension method, for example. Specifically, the piezoelectric layer 200 can be manufactured by a method including a step of melt-kneading raw materials and then forming the raw materials into a sheet by an extrusion method, and a step of uniaxially extending the obtained sheet to obtain a post extension film. According to such a method, the post extension film is obtained in which the c-axis of the helical chiral polymer is uniaxially oriented in the plane. This method has excellent mass manufacturability, and thus the piezoelectric layer 200 can be easily cost reduced.

Among these, it is preferred for the helical chiral polymer to be a polylactic acid. The polylactic acid has relatively high mechanical strength and excellent formability, and thus is particularly useful as the helical chiral polymer contained in the piezoelectric layer 200. That is, mechanical strength and formability of the piezoelectric layer 200 can be easily enhanced by containing the polylactic acid.

The following describes a polylactic acid as a helical chiral polymer as an example. As the polylactic acid having optical activity, an L-type polylactic acid (PLLA) and a D-type polylactic acid (PDLA) are known. Here, an L-type polylactic acid of α-phase that is stable in the L-type polylactic acid, particularly, the crystalline phase of the L-type polylactic acid, will be described as an example. Note that in the description below, the L-type polylactic acid of α phase is simply referred to as "polylactic acid".

Figure 4A:
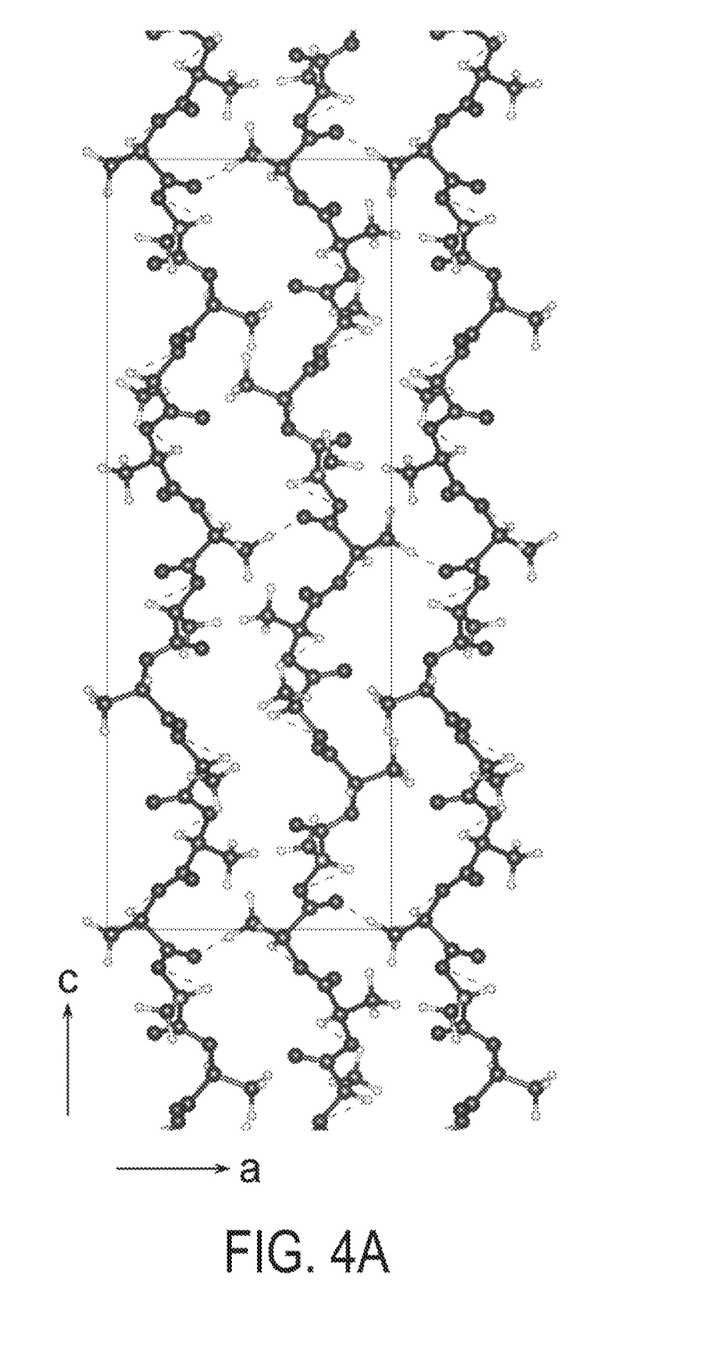
FIG. 4A is a schematic view illustrating a molecular structure of a polylactic acid.
Figure 4B:
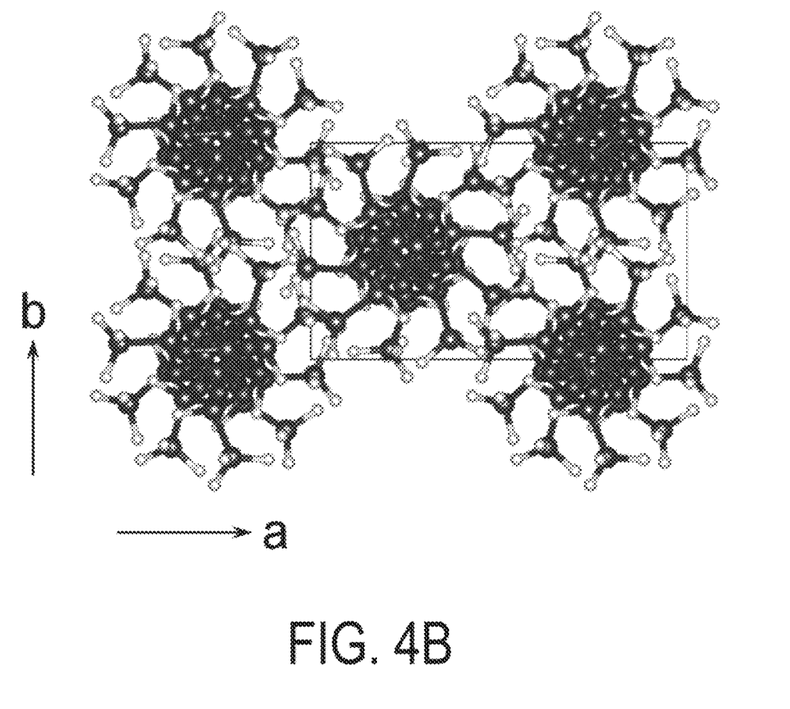
FIG. 4B is a schematic view illustrating a molecular structure of a polylactic acid.

FIGS. 4A and 4B are each a schematic view illustrating the molecular structure of the polylactic acid.

The molecular structure of the polylactic acid has a helical structure, as illustrated in FIGS. 4A and 4B. The crystalline system of the polylactic acid is an orthorhombic crystal, where the length of an a-axis of the unit lattice is approximately 1.06 nm, the length of a b-axis is approximately 0.61 nm, and the length of the c-axis is approximately 2.88 nm. Note that FIG. 4A illustrates a plane including the a-axis and the c-axis in the polylactic acid, and FIG. 4B illustrates a plane including the a-axis and the b-axis in the polylactic acid.

It is sufficient for the piezoelectric layer 200 to contain the polylactic acid, and it is preferred for the piezoelectric layer 200 to contain the polylactic acid as a main material. The content ratio of the polylactic acid in the piezoelectric layer 200 is preferably 30 mass % or greater, more preferably 50 mass % or greater, and still more preferably 70 mass % or greater. Note that the piezoelectric layer 200 may contain a polylactic acid amorphous material in addition to the polylactic acid, for example. Also, in addition to the above-described L-type polylactic acid of α-phase, the piezoelectric layer 200 may contain an L-type polylactic acid of α' phase, β phase, or the like that is metastable phase, or the D-type polylactic acid.

Figure 5:
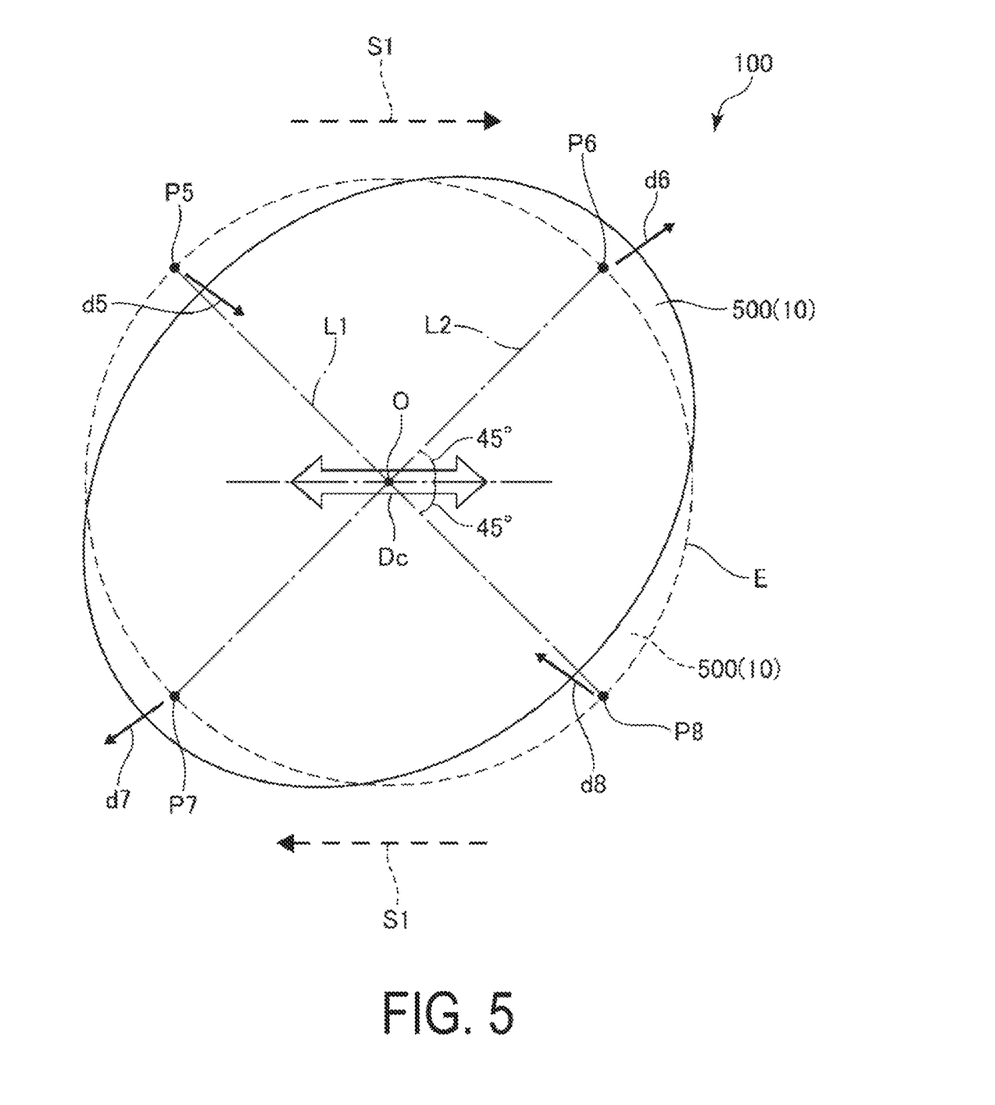
FIG. 5 is a plan view illustrating only a layered body in FIG. 1.
Figure 6:
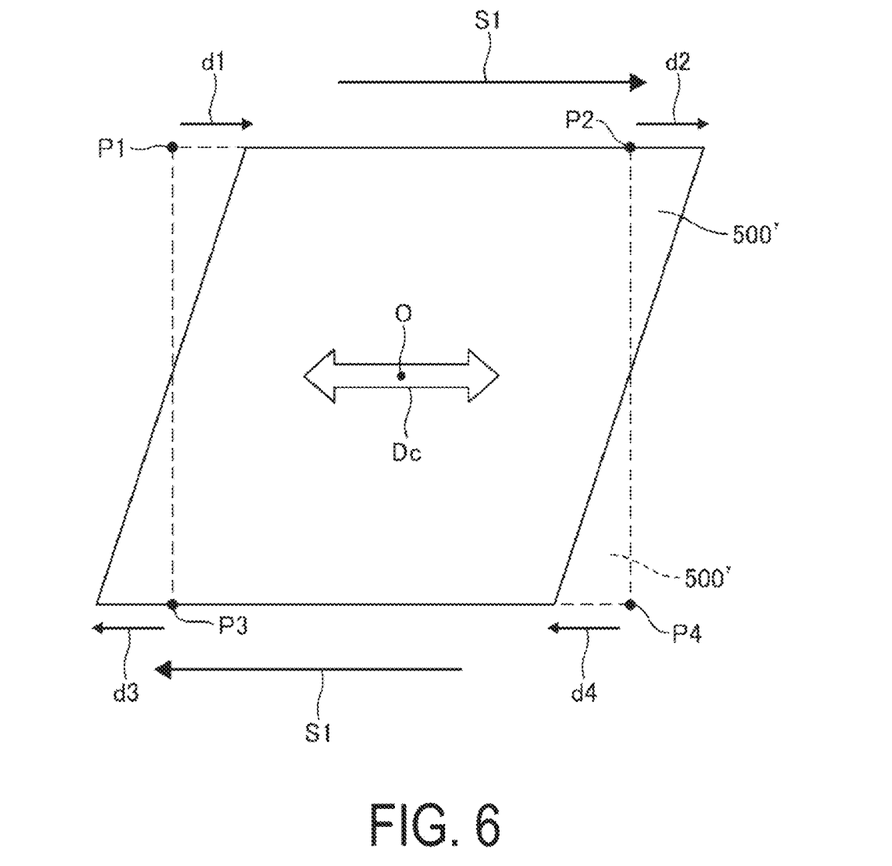
FIG. 6 is a plan view illustrating a layered body included in a piezoelectric element as a comparative example, the layered body being formed by changing a shape of a layered body in FIG. 5 to square.

FIG. 5 is a plan view illustrating only the layered body 500 in FIG. 1. FIG. 6 is a plan view illustrating a layered body 500' formed by changing the shape of the layered body 500 in FIG. 5 to square, which is an example of a layered body included in a piezoelectric element as a comparative example.

In the layered body 500' illustrated in FIG. 6, the c-axis of the helical chiral polymer, for example, the c-axis of the polylactic acid is oriented along an orientation direction Dc. In the layered body 500' thus configured, when shear stress parallel to the c-axis is applied as illustrated by the two arrows in FIG. 6, a rotational motion of the electric dipole of C=O inside the helical structure is induced and then polarization appears in a direction intersecting a shear plane including two shear stress vectors S1 that are applied. That is, polarization appears in a direction intersecting the plane in which the layered body 500' outspreads.

When an electric field is applied to the layered body 500' exhibiting such piezoelectric properties in a direction intersecting the shear plane, shear deformation occurs in the layered body 500' due to the inverse piezoelectric effect. When the layered body 500' before deformation has a square shape indicated by the dashed line in FIG. 6, the layered body 500' having been deformed becomes parallelogram as indicated by the solid line. This shear deformation is deformation based on the stress expressed by the two shear stress vectors S1, and because of a mutual difference between the lines of action of the two shear stress vectors S1, it is not easy to make use of this deformation in the piezoelectric element provided with the layered body 500'. In particular, apexes P1, P2, P3, and P4 of the layered body 500' are displaced parallel to the shear stress vector S1, as illustrated by displacements d1, d2, d3, and d4 in FIG. 6. In the related art, a piezoelectric element making use of the shear deformation, which is processed into a special shape such as a braided piezoelectric element, has been materialized, and in which there is an issue in terms of complexity of structure and difficulty in manufacture.

In view of the above, in the piezoelectric element 100 according to the embodiment, an overlapped portion 10 where the piezoelectric layer 200, the first electrode layer 300, and the second electrode layer 400 overlap with one another, that is, the layered body 500 is circular shaped, as illustrated in FIG. 5. In particular, the layered body 500 is caused to be an exact circle in FIG. 5. When an electric field is applied to the layered body 500 thus configured in a direction intersecting the shear plane, shear deformation occurs, due to the inverse piezoelectric effect, based on the shear stress vector S1 as in the layered body 500' illustrated in FIG. 6. At this time, the layered body 500 is circular shaped, thus the shear deformation is converted into telescopic deformation.

Specifically, in the layered body 500' in FIG. 6, the lines of action of the displacements d1 and d4 occurring at the two mutually opposing apexes P1 and P4 are different from each other. Specifically, the direction of the displacement d1 and the direction of the displacement d4 are on mutually different straight lines. More specifically, when a non-illustrated reference line connecting the apexes P1 and P4 is drawn, the angle formed by the direction of the displacement d1 and the reference line, and the angle formed by the direction of the displacement d4 and the reference line are each greater than 20 degrees. The lines of action of the displacements d2 and d3 occurring in the two mutually opposing apexes P2 and P3 are also different from each other. Specifically, the direction of the displacement d2 and the direction of the displacement d3 are on mutually different straight lines. More specifically, when a non-illustrated reference line connecting the apexes P2 and P3 is drawn, the angle formed by the direction of the displacement d2 and the reference line, and the angle formed by the direction of the displacement d3 and the reference line are each greater than 20 degrees.

In contrast, in the layered body 500 in FIG. 5, the lines of action of displacements d5 and d8 occurring at an outer edge E are substantially overlapped with each other. The displacement d5 is a displacement at an intersection point P5 between a reference line L1 and the outer edge E of the layered body 500 before deformation. The displacement d8 is a displacement at an intersection point P8 between the reference line L1 and the outer edge E of the layered body 500 before deformation. The substantial overlapping of the lines of action of the displacements d5 and d8 refers to a state where the angle formed by the direction of the displacement d5 and the reference line L1 and the angle formed by the direction of the displacement d8 and the reference line L1 are each in a state of being not greater than 20 degrees. The reference line L1 is a straight line having an angle of 45 degrees with respect to the orientation direction Dc and passing through a center O of the layered body 500 before deformation.

Also, in the layered body 500 in FIG. 5, the lines of action of displacements d6 and d7 occurring at the outer edge E are substantially overlapped with each other. The displacement d6 is a displacement at an intersection point P6 between a reference line L2 and the outer edge E of the layered body 500 before deformation. The displacement d7 is a displacement at an intersection point P7 between the reference line L2 and the outer edge E of the layered body 500 before deformation. The substantial overlapping of the lines of action of the displacements d6 and d7 refers to a state where the angle formed by the direction of the displacement d6 and the reference line L2 and the angle formed by the direction of the displacement d7 and the reference line L2 are each in a state of being not greater than 20 degrees. The reference line L2 is a straight line orthogonal to the reference line L1 and passing through the center O of the layered body 500 before deformation.

Moreover, the displacements d5 and d8 are substantially oppositely oriented to each other, and the displacements d6 and d7 are also substantially oppositely oriented to each other. Such a mechanism makes the shear deformation converted into telescopic deformation in the layered body 500.

Also, the layered body 500 in FIG. 5 is circular shaped in plan view, thus the orientations of the displacements d5, d6, d7, and d8 each intersect at a large angle with the outer edge E, specifically, the angle formed by the orientations of the displacements d5, d6, d7, and d8 illustrated by the arrows in FIG. 5 and the outer edge E may be from 70 degrees to 90 degrees. This allows, when the displacement of the layered body 500 is used in a device or the like, the outer edge E of the layered body 500 to be less likely to interfere with other members and the like, thereby improving the ease of use.

In the telescopic deformation illustrated in FIG. 5, the displacements d6 and d7 going away from the center O occur at the intersection points P6 and P7 when an electric field is applied to the piezoelectric layer 200, so as to generate the displacements d5 and d8 by which the intersection points P5 and P8 come close to the center O, as illustrated in FIG. 5. Conversely, although not illustrated, displacements coming close to the center O occur at the intersection points P6 and P7 when an electric field is applied to the piezoelectric layer 200 so as to generate displacements by which the intersection points P5 and P8 go away from the center O.

In contrast, the center O of the layered body 500 is scarcely displaced. Accordingly, the telescopic deformation of the layered body 500 is scarcely affected even when the center O is fixed. As a consequence, in the piezoelectric element 100 according to the embodiment, the first coupling portion 600 and the second coupling portion 700 are provided at positions overlapping in plan view with the center O in order to fix the layered body 500.

The first coupling portion 600 is provided on an opposite side of the first electrode layer 300 from the piezoelectric layer 200, and may be a member having higher rigidity than the first electrode layer 300. The second coupling portion 700 is also provided on an opposite side of the second electrode layer 400 from the piezoelectric layer 200, and may be a member having higher rigidity than the second electrode layer 400. It is possible, by clamping the layered body 500 with such a highly rigid member, to fix the layered body 500 with a simple structure and without affecting the telescopic deformation.

Also, the first coupling portion 600 electrically couples the first wiring 800 with the first electrode layer 300. The second coupling portion 700 electrically couples the second wiring 900 with the second electrode layer 400. Thus, a voltage can be applied to the first electrode layer 300 and the second electrode layer 400 via the first wiring 800 and the second wiring 900, and the electric charge extracted by the first electrode layer 300 and the second electrode layer 400 can be delivered to the first wiring 800 and the second wiring 900. In addition, the first coupling portion 600 and the second coupling portion 700 are scarcely displaced, as described above. This makes it possible, in the above-described structure, to reduce breakage and detachment due to vibration of the first wiring 800 and the second wiring 900.

Also, when the piezoelectric layer 200 is viewed along the thickness direction, the first coupling portion 600 overlaps with the center O of the layered body 500 and is configured smaller than the first electrode layer 300. The first coupling portion 600 overlapping with the center O means that the center O is located inside the range of the first coupling portion 600. Also, the first coupling portion 600 being smaller than the first electrode layer 300 means that the first coupling portion 600 falls inside the range of the first electrode layer 300.

Moreover, when the piezoelectric layer 200 is viewed along the thickness direction, the second coupling portion 700 overlaps with the center O of the layered body 500 and is configured smaller than the second electrode layer 400. The second coupling portion 700 overlapping with the center O means that the center O is located inside the range of the second coupling portion 700. Also, the second coupling portion 700 being smaller than the second electrode layer 400 means that the second coupling portion 700 falls inside the range of the second electrode layer 400.

According to the above-described configuration, the layered body 500 is regarded as being able to be fixed, via the first coupling portion 600 and the second coupling portion 700, to any position in a space by the first wiring 800 and the second wiring 900, and is electrically coupled to the first wiring 800 and the second wiring 900. This allows the piezoelectric element 100 to be an element that is suitably used in various devices by making use of piezoelectric properties accompanied with telescopic deformation.

Figure 7:
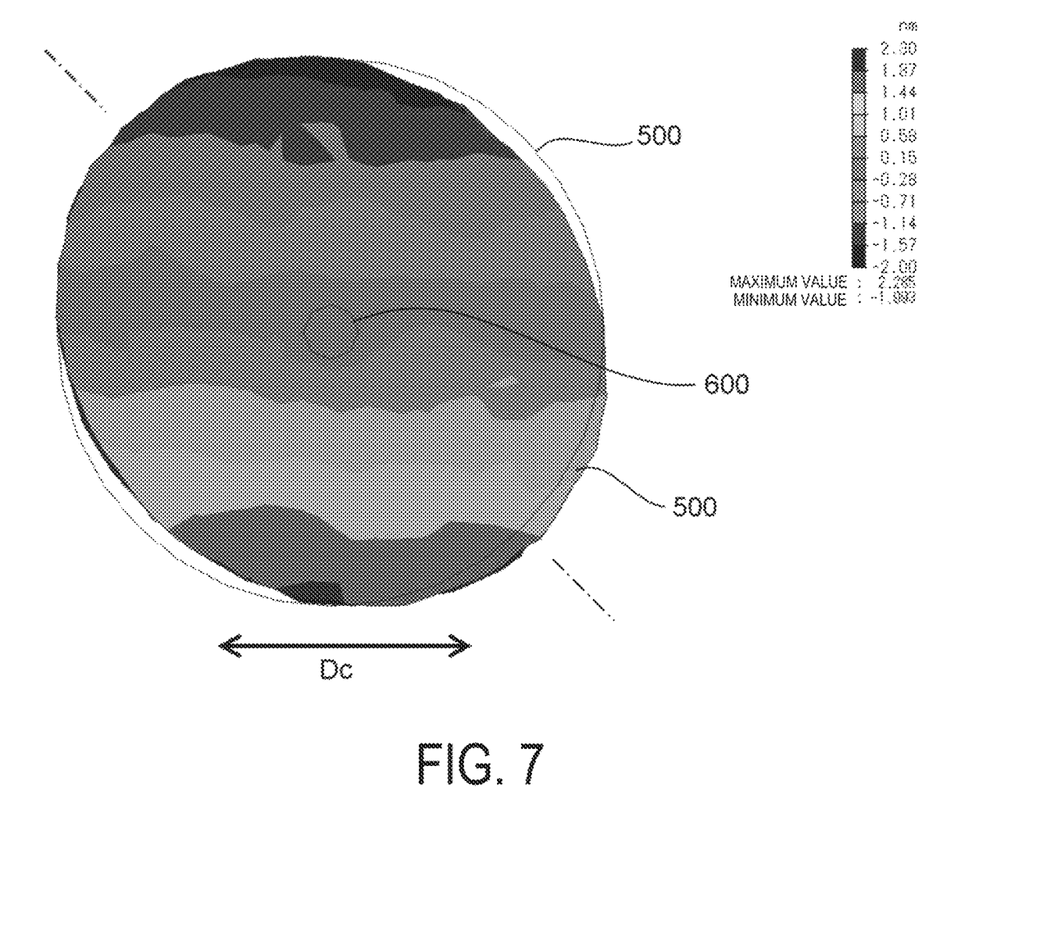
FIG. 7 is a diagram illustrating a result of simulating a distribution of displacement amounts of a layered body when a voltage is applied between a first electrode layer and a second electrode layer of a piezoelectric element illustrated in FIG. 1.

Here, FIG. 7 is a diagram illustrating a result of simulating a distribution of displacement amounts of the layered body 500 when a voltage is applied between the first electrode layer 300 and the second electrode layer 400 of the piezoelectric element 100 illustrated in FIG. 1. Analysis simulation software Femtet available from Murata Software Co., Ltd. is used for the simulation. In this simulation, the layered body 500 that forms an exact circle is fixed by the first coupling portion 600 and the second coupling portion 700 (not illustrated), where in this state, the displacement amounts of the points on the layered body 500 are calculated when an electric field is applied to the piezoelectric layer 200 containing a polylactic acid. Note that, in FIG. 7, the orientation direction Dc of the piezoelectric layer 200 is indicated by an arrow. Also, in FIG. 7, the outer edge of the layered body 500 before deformation is indicated by the solid line, and the displacement amounts of the points on the layered body 500 after deformation are illustrated by a graded pattern.

The piezoelectric element 100 is deformed so as to stretch in a direction obliquely intersecting the orientation direction Dc, that is, in the direction indicated by the dashed-dotted line in FIG. 7 and deformed so as to contract in a direction intersecting the diagonal direction when the c-axis of the polylactic acid is uniaxially oriented in the orientation direction Dc in the plane, as illustrated in FIG. 7. Also, because of the fact that the graded pattern in FIG. 7 varies along a direction obliquely intersecting the orientation direction Dc, the displacement amounts of the points illustrated in FIG. 7 are distributed so as to be inclined along a direction obliquely intersecting the orientation direction Dc.

From the above-described simulation result, it can be recognized that shear deformation can be converted into telescopic deformation in the piezoelectric element 100.

Also, the fact that the c-axis of the helical chiral polymer is uniaxially oriented in the plane of the piezoelectric layer 200 can be identified by acquiring and analyzing an X-ray diffraction profile of the piezoelectric layer 200. Specifically, first, a θ–2θ measurement using an X-ray diffraction apparatus is conducted on the piezoelectric layer 200 to obtain a θ–2θ profile.

Figure 8:
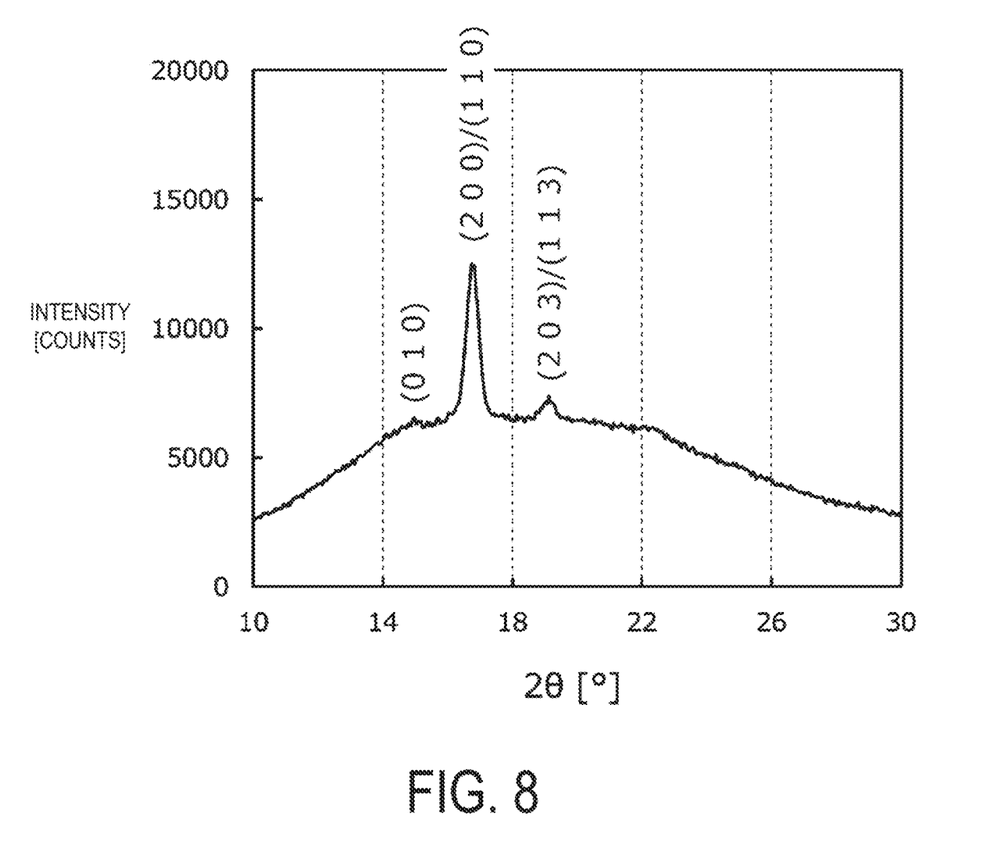
FIG. 8 illustrates one example of a$\theta$–$2\theta$ profile obtained by a $\theta$–$2\theta$ measurement by an X-ray diffraction apparatus for a piezoelectric layer containing a polylactic acid having a uniaxially oriented c-axis.

FIG. 8 illustrates one example of the θ–2θ profile obtained by the θ–2θ measurement by the X-ray diffraction apparatus for a piezoelectric layer containing a polylactic acid in which the c-axis is uniaxially oriented. When the c-axis of the polylactic acid is uniaxially oriented, peaks corresponding to (200) and (110) planes of the polylactic acid are observed in the θ–2θ profile, as illustrated in FIG. 8. These peaks are observed at 2θ=16.7 degrees±1.0 degrees. Note that these peak positions are peak positions by aθ–2θ measurement using a characteristic X-ray of CuKα1 of the wavelength of 1.5404 Å.

Figure 9:
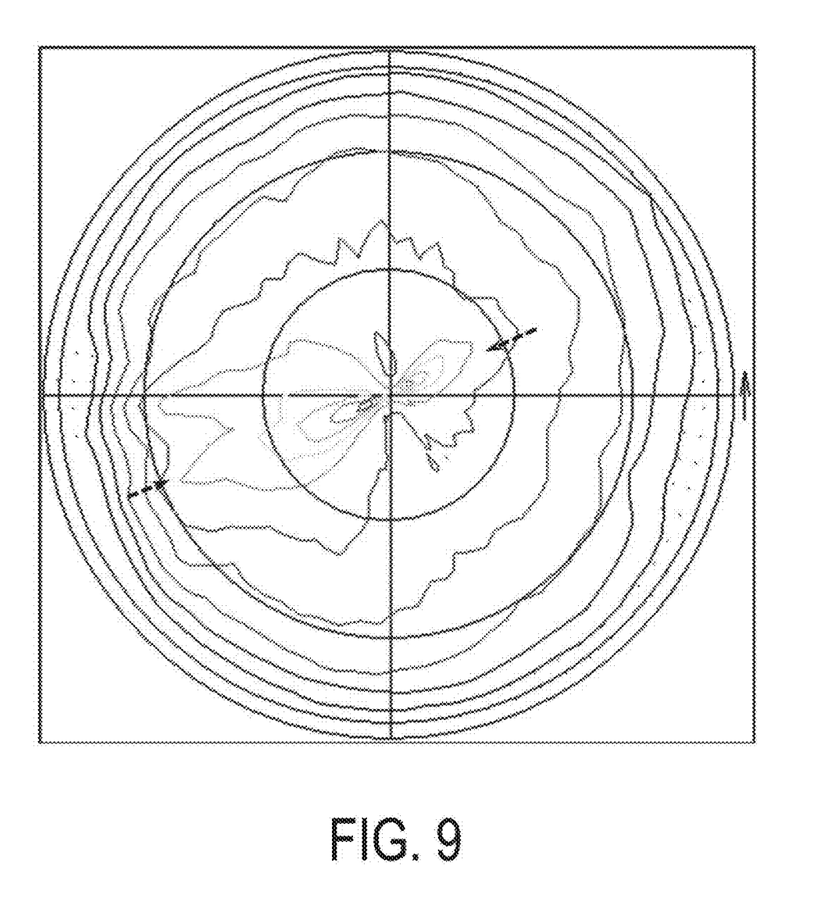
FIG. 9 illustrates one example of a pole figure obtained by fixing a $2\theta$ position to 16.7 degrees for a piezoelectric layer for which a $\theta$–$2\theta$ profile illustrated in FIG. 8 is obtained.

A pole figure is then obtained for these peaks. FIG. 9 illustrates one example of the pole figure obtained by fixing a 2θ position to 16.7 degrees for the piezoelectric layer for which the θ–2θ profile illustrated in FIG. 8 is obtained. In this pole figure, level curves indicating diffraction intensities linearly extend so as to pass through the center that is ψ=0 degree, as illustrated by the dashed arrows in FIG. 9. In the pole figure illustrated in FIG. 9, it can be identified that the c-axis of the polylactic acid is uniaxially oriented in the plane of the piezoelectric layer, provided that such characteristics of the pole figure can be recognized.

The piezoelectric element 100 according to the embodiment includes the piezoelectric layer 200, the first electrode layer 300, the second electrode layer 400, the first coupling portion 600, and the second coupling portion 700, as described above. The piezoelectric layer 200 includes a helical chiral polymer including the first plane 201 and the second plane 202 having a front and back relationship with each other and exhibiting piezoelectric properties. The first electrode layer 300 is provided at the first plane 201 of the piezoelectric layer 200. The second electrode layer 400 is provided at the second plane 202 of the piezoelectric layer 200. The first coupling portion 600 is provided on an opposite side of the first electrode layer 300 from the piezoelectric layer 200. The second coupling portion 700 is provided on an opposite side of the second electrode layer 400 from the piezoelectric layer 200.

Further, when viewed along the thickness direction of the piezoelectric layer 200, the overlapped portion 10, that is, the layered body 500 where the piezoelectric layer 200, the first electrode layer 300, and the second electrode layer 400 overlap with one another is circular shaped. Also, when viewed along the thickness direction of the piezoelectric layer 200, the first coupling portion 600 and the second coupling portion 700 overlap with the center O (the center of the overlapped portion 10) of the layered body 500.

According to such a configuration, the overlapped portion 10 is circular shaped, thus it is possible to convert shear deformation occurring in association with the piezoelectric properties of the helical chiral polymer into telescopic deformation. This makes it possible to achieve the piezoelectric element 100 that facilitates the use of the piezoelectric properties of the helical chiral polymer.

Also, when viewed along the thickness direction of the piezoelectric layer 200, the first coupling portion 600 is smaller than the first electrode layer 300, and it is preferred for the second coupling portion 700 to be smaller than the second electrode layer 400 when viewed along the thickness direction of the piezoelectric layer 200.

The first coupling portion 600 and the second coupling portion 700 have the above-described characteristics, thus the first coupling portion 600 and the second coupling portion 700 enable the layered body 500 to be fixed without inhibiting telescopic deformation occurring in the piezoelectric layer 200.

The piezoelectric element 100 thus configured is used in various devices making use of the telescopic deformation. Examples of such devices include actuators, vibration generators, ultrasonic motors, tactile sensors, force sensors, electric power generation elements, various types of switches, and the like, for example.

Also, it is possible in the piezoelectric element 100 to provide, by the first coupling portion 600 and the second coupling portion 700, an electric coupling and a mechanical coupling with the layered body 500. Accordingly, the fixed structure of the piezoelectric element 100 can be simplified when incorporating the piezoelectric element 100 into various types of devices. This makes it possible, by using the piezoelectric element 100, to easily increase the design freedom of the devices.

Also, it is preferred for the first coupling portion 600 to have higher rigidity than the first electrode layer 300, and for the second coupling portion 700 to have higher rigidity than the second electrode layer 400. This makes the first coupling portion 600 and the second coupling portion 700 particularly hard to be deformed, which enables the layered body 500 to be more stably fixed.

The rigidity of the first coupling portion 600 being greater than the rigidity of the first electrode layer 300 means that the bending rigidity of the first coupling portion 600 is greater than the bending rigidity of the first electrode layer 300. Similarly, the rigidity of the second coupling portion 700 being greater than the rigidity of the second electrode layer 400 means that the bending rigidity of the second coupling portion 700 is greater than the bending rigidity of the second electrode layer 400. The bending rigidity is expressed by a product of Young's modulus and second moment of area, in which the second moment of area becomes small when the thickness is thin with respect to the bending direction. In view of the above, in the embodiment, the thicknesses of the first coupling portion 600 and the second coupling portion 700 in the thickness direction of the layered body 500 are made sufficiently thick compared to the first electrode layer 300 and the second electrode layer 400.

Specifically, assuming that the thickness of the first coupling portion 600 is t6, it is preferred for the thickness t6 to be not less than two times of the average thickness t3 of the first electrode layer 300, and more preferred from 10 times to 1000 times, as illustrated in FIG. 2. This makes it possible to make the bending rigidity of the first coupling portion 600 greater than the bending rigidity of the first electrode layer 300.

Also, assuming that the thickness of the second coupling portion 700 is t7, it is preferred for the thickness t7 to be not less than two times of the average thickness t4 of the second electrode layer 400, and more preferred from 10 times to 1000 times. This makes it possible to make the bending rigidity of the second coupling portion 700 greater than the bending rigidity of the second electrode layer 400.

In FIG. 3, the radius of the layered body 500 (the overlapped portion 10) is R1, and a circle having a radius of r1 from the center O is C1. Also, the radius r1 is 20% of the radius R1. When viewed along the thickness direction of the piezoelectric layer 200, it is preferred for the first coupling portion 600 to be disposed inside a circle C1, as illustrated in FIG. 3.

According to such a configuration, it is possible to prevent the range occupied by the first coupling portion 600 from becoming excessively greater. That is, the range occupied by the first coupling portion 600 can be set to a size that is necessary and sufficient to make the layered body 500 fixed thereto. This makes it possible to achieve the piezoelectric element 100 configured to effectively make use of piezoelectric properties accompanied with telescopic deformation.

Also, although not illustrated, it is preferred for the second coupling portion 700 to be disposed inside the circle C1 as well. This makes it possible to prevent the range occupied by the second coupling portion 700 from becoming excessively greater.

Note that it is preferred for the radius r1 to be less than 20% of the radius R1 and more preferred less than 15% of the radius R1.

2. Second Modified Example

Next, a piezoelectric element according to a modified example will be described.

Figure 10:
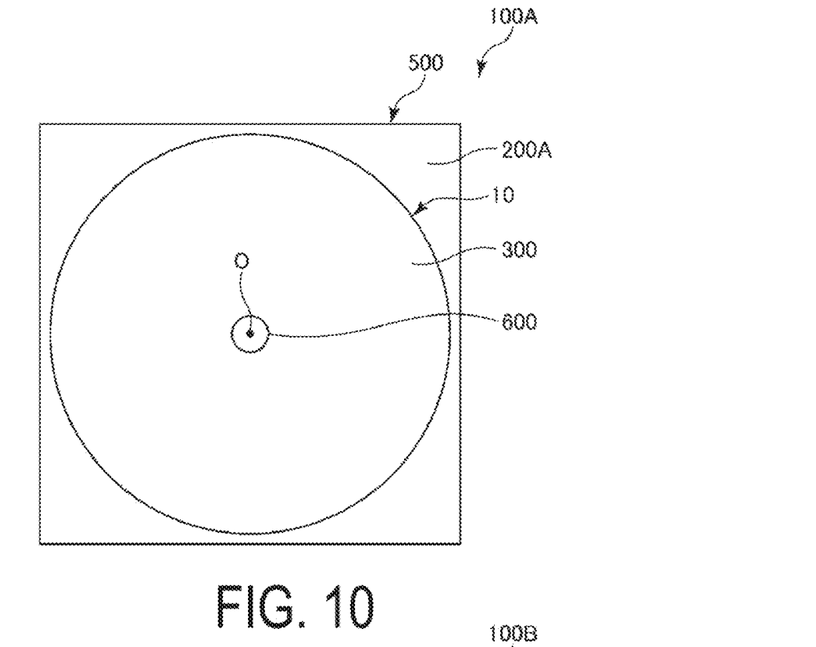
FIG. 10 is a plan view illustrating a modified example of a piezoelectric element according to an embodiment.
Figure 11:
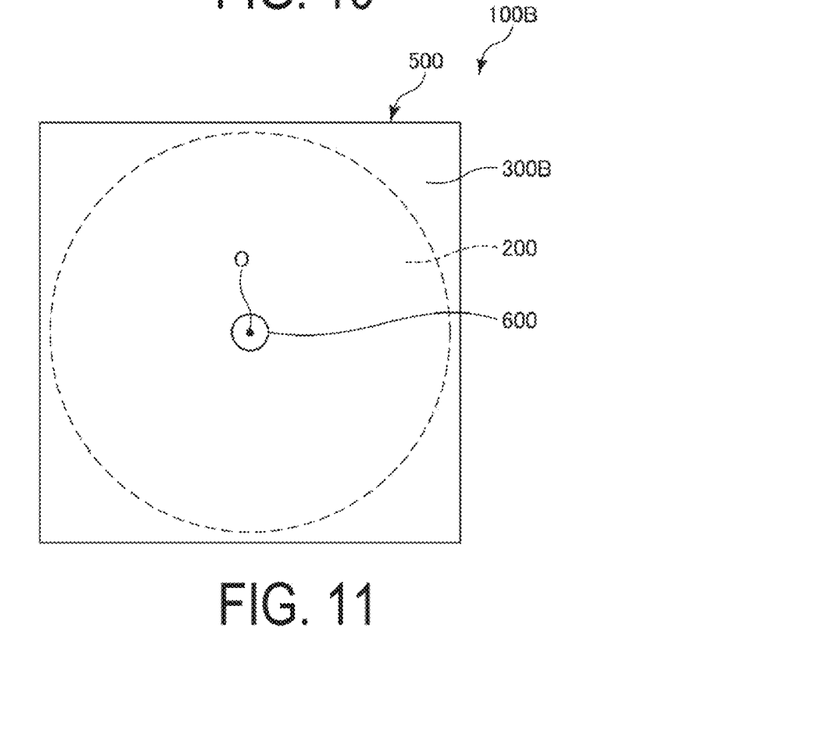
FIG. 11 is a plan view illustrating a modified example of a piezoelectric element according to an embodiment.

FIGS. 10 and 11 are plan views each illustrating a modified example of the piezoelectric element 100 according to the embodiment.

In the following, the modified example will be described with a focus on differences from the above-described embodiment, and descriptions of similar matters will be omitted. Note that the configurations as in the above-described embodiment are denoted by the same reference signs in FIGS. 10 and 11.

A piezoelectric element 100A illustrated in FIG. 10 is the same as the piezoelectric element 100 according to the above-described embodiment except that a piezoelectric layer 200A is different in shape from the first electrode layer 300.

That is, the piezoelectric layer 200A illustrated in FIG. 10 is square shaped in plan view. Also, the first electrode layer 300 and the second electrode layer (not illustrated) are each housed inside the range of the piezoelectric layer 200A. Thus, the overlapped portion 10 where the piezoelectric layer 200A, the first electrode layer 300, and the second electrode layer are overlapped with one another is circular shaped, as in the above-described embodiment. As a consequence, the piezoelectric element 100A illustrated in FIG. 10 also provides an effect of converting shear deformation into telescopic deformation, that is, the same effect as in the above-described embodiment.

As such, the first electrode layer 300 illustrated in FIG. 10 and the second electrode layer (not illustrated) are each circular shaped. This makes it possible to achieve the above-described effect, and the piezoelectric layer 200A illustrated in FIG. 10, which is irrespective of the shape, has an advantage of being easily manufactured. Thus, the piezoelectric layer 200A is not limited to square shaped, and may be formed in any shape.

A piezoelectric element 100B illustrated in FIG. 11 is the same as the piezoelectric element 100 according to the above-described embodiment except that a first electrode layer 300B is different in shape from the piezoelectric layer 200.

That is, the first electrode layer 300B illustrated in FIG. 11 is square shaped in plan view. Also, although not illustrated, the shape in plan view of the second electrode layer is the same as in the first electrode layer 300B. Moreover, the piezoelectric layer 200 falls inside the range of the first electrode layer 300B. Thus, the overlapped portion 10 where the piezoelectric layer 200, the first electrode layer 300B, and the second electrode layer overlap with one another is circular shaped, as in the above-described embodiment. As a consequence, the piezoelectric element 100B illustrated in FIG. 11 also provides an effect of converting shear deformation into telescopic deformation, that is, the same effect as in the above-described embodiment.

As such, the piezoelectric layer 200 illustrated in FIG. 11 is circular shaped. This makes it possible to achieve the above-described effect, and the first electrode layer 300B illustrated in FIG. 11 and the second electrode layer (not illustrated), which are irrespective of the shape, have an advantage of being easily manufactured. Thus, the first electrode layer 300B and the second electrode layer are not limited to square shaped, and may be formed in any shape.

Note that, although not illustrated in FIG. 11, the first electrode layer 300B illustrated in FIG. 11 and the second electrode layer (not illustrated) are insulated from each other at the outside of the piezoelectric layer 200.

Also. in the piezoelectric element 100B illustrated in FIG. 11, the piezoelectric layer 200 is disposed inside the first electrode layer 300B and the second electrode layer, and is protected from the outside. This allows the piezoelectric element 100B to have an advantage that the piezoelectric layer 200 is less susceptible to damage and easily made more highly reliable.

The piezoelectric element of the present disclosure has been described as above based on the illustrated embodiment, and the piezoelectric element of the present disclosure is not limited to the above-described embodiments. The components of the embodiments may be substituted with any component of configuration having the same function, and any constituent may be added to the embodiments, for example.

What is claimed is:

1. A piezoelectric element, comprising:
   a piezoelectric layer including a first plane and a second plane having a front and back relationship with each other, the piezoelectric layer containing a helical chiral polymer exhibiting piezoelectric properties;
   a first electrode layer provided on the first plane of the piezoelectric layer;
   a second electrode layer provided on the second plane of the piezoelectric layer;
   a first coupling portion provided on the first electrode layer, and
   a second coupling portion provided on the second electrode layer, wherein
   an overlapped portion where the piezoelectric layer, the first electrode layer, and the second electrode layer overlap is circular shaped when viewed along a thickness direction of the piezoelectric layer, and
   the first coupling portion and the second coupling portion overlap with a center of the overlapped portion when viewed along the thickness direction of the piezoelectric layer, and
   the helical chiral polymer has a molecular structure that is a helical structure, and provided that an axis of the helical structure is a c-axis, the helical chiral polymer is a crystal in which the c-axis is uniaxially oriented in a plane of the piezoelectric laver.

2. The piezoelectric element according to claim 1, wherein
   the first coupling portion has higher rigidity than the first electrode layer, and
   the second coupling portion has higher rigidity than the second electrode layer.

3. The piezoelectric element according to claim 1, wherein
   the first coupling portion is smaller than the first electrode layer when viewed along the thickness direction of the piezoelectric layer, and
   the second coupling portion is smaller than the second electrode layer when viewed along the thickness direction of the piezoelectric layer.

4. The piezoelectric element of claim 1, wherein
the first coupling portion is disposed inside a circle having a radius that is 20% of a radius of the overlapped portion.

5. The piezoelectric element according to claim 1, wherein the helical chiral polymer is a polylactic acid.

6. The piezoelectric element according to claim 1, wherein
the first electrode layer and the second electrode layer are circular shaped.

7. The piezoelectric element according to claim 1, wherein
the piezoelectric layer is circular shaped.

* * * * *